(12) United States Patent
Pal et al.

(10) Patent No.: US 9,202,810 B2
(45) Date of Patent: Dec. 1, 2015

(54) INTEGRATION OF ANALOG TRANSISTOR (71) Applicant: Texas Instruments Incorporated, Dallas, TX (US)

(72) Inventors: Himadri Sekhar Pal, Allen, TX (US); Shashank S. Ekbote, Allen, TX (US); Youn Sung Choi, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 6 days.

(21) Appl. No.: 14/244,180

(22) Filed: Apr. 3, 2014

(65) Prior Publication Data

US 2015/0287717 A1   Oct. 8, 2015

(51) Int. Cl.

| H01L 21/336 | (2006.01) |
|---|---|
| H01L 27/088 | (2006.01) |
| H01L 29/78 | (2006.01) |
| H01L 29/66 | (2006.01) |
| H01L 29/10 | (2006.01) |
| H01L 29/08 | (2006.01) |
| H01L 29/423 | (2006.01) |
| H01L 21/265 | (2006.01) |
| H01L 21/266 | (2006.01) |
| H01L 29/167 | (2006.01) |
| H01L 21/8234 | (2006.01) |

(52) U.S. Cl.
CPC ............ *H01L 27/088* (2013.01); *H01L 21/266* (2013.01); *H01L 21/26513* (2013.01); *H01L 21/26586* (2013.01); *H01L 21/823418* (2013.01); *H01L 21/823456* (2013.01); *H01L 29/0847* (2013.01); *H01L 29/1095* (2013.01); *H01L 29/167* (2013.01); *H01L 29/42372* (2013.01); *H01L 29/66659* (2013.01); *H01L 29/7835* (2013.01)

(58) Field of Classification Search
CPC .................................. H01L 21/26589
See application file for complete search history.

(56) References Cited

U.S. PATENT DOCUMENTS

| 6,680,226 B2 * | 1/2004 | Efland et al. ................... 438/200 |
| 7,144,782 B1 * | 12/2006 | Ehrichs ............................. 438/286 |
| 8,633,082 B2 * | 1/2014 | Lasserre et al. .............. 438/286 |

* cited by examiner

*Primary Examiner* — Zandra Smith
*Assistant Examiner* — Andre' C Stevenson
(74) *Attorney, Agent, or Firm* — Jacqueline J. Garner; Frank D. Cimino (57) ABSTRACT

An integrated circuit has two parallel digital transistors and a perpendicular analog transistor. The digital transistor gate lengths are within 10 percent of each other and the analog gate length is at least twice the digital transistor gate length. The first digital transistor and the analog transistor are implanted by a first LDD implant which includes a two sub-implant angled halo implant process with twist angles perpendicular to the first digital transistor gate edge and parallel to the analog transistor gate edge. The second digital transistor and the analog transistor are implanted by a second LDD implant which includes a two sub-implant angled halo implant process with twist angles perpendicular to the second digital transistor gate edge and parallel to the analog transistor gate edge. The first halo dose is at least 20 percent more than the second halo dose.

14 Claims, 10 Drawing Sheets

INTEGRATION OF ANALOG TRANSISTOR

FIELD OF THE INVENTION

This invention relates to the field of integrated circuits. More particularly, this invention relates to MOS transistors in integrated circuits.

BACKGROUND OF THE INVENTION

An integrated circuit containing digital metal oxide semiconductor (MOS) transistors and analog MOS transistors is fabricated to provide low off-state currents in the digital MOS transistors using halo implants to form halo regions which limit the lateral extents of drain extensions, referred to as lightly doped drain (LDD) regions, under the gates of the digital MOS transistors. The halo regions have an opposite conductivity type from the LDD regions. The analog MOS transistors require uniform threshold voltages, which can be achieved by forming larger LDD regions compared to the digital MOS transistors and by not laterally limiting the larger LDD regions with halo regions under the gates of the analog MOS transistors. However, fabricating the analog MOS transistors with dedicated implants undesirably increases fabrication cost and complexity of the integrated circuit.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit includes a first digital MOS transistor, a second digital MOS transistor and an analog MOS transistor, all of a same polarity. The first and second digital MOS transistors have a first gate and a second gate, respectively, that are parallel to each other with gate lengths that are within 10 percent of each other. The analog MOS transistor has an analog gate that is perpendicular to the first gate and the second gate and has a gate length at least twice the gate length of the first gate. The first digital MOS transistor has first LDD regions which extend partway under the first gate and has first halo regions extending past the first LDD regions under the first gate. The second digital MOS transistor has second LDD regions which extend partway under the second gate and has second halo regions extending past the second LDD regions under the second gate. An average doping density of the first halo regions is at least 20 percent more than an average doping density of the second halo regions. The analog MOS transistor has analog LDD regions which have an average doping density of at least 75 percent of a sum of an average doping density of the first LDD regions and an average doping density of the second LDD regions. The analog MOS transistor has analog halo regions which do not extend as far under the analog gate as the analog LDD regions. An average doping density of the analog halo regions is at least 75 percent of a sum of an average doping density of the first halo regions and an average doping density of the second halo regions.

The integrated circuit is formed by forming a first LDD mask which exposes the first digital MOS transistor and the analog MOS transistor, and covers the second digital MOS transistor. Subsequently, a first LDD implant process is performed which implants first LDD dopants to form the first LDD regions in a substrate of the integrated circuit adjacent to and extending partway under the first gate and to form a portion of the analog LDD regions in the substrate adjacent to and extending partway under the analog gate. A first halo implant process is performed which implants first halo dopants to form the first halo regions in the substrate adjacent to the first gate and extending past the first LDD regions under the first gate, and to form a portion of the analog halo regions in the substrate adjacent to the analog gate. The first halo implant process is performed in two sub-implants, at tilt angles of at least 15 degrees, with twist angles opposite from each other, so that each sub-implant of the two sub-implants has a twist angle perpendicular to the first gate and parallel to the analog gate. The first LDD mask is subsequently removed. A second LDD mask is formed which exposes the second digital MOS transistor and the analog MOS transistor, and covers the first digital MOS transistor. Subsequently, a second LDD implant process is performed which implants second LDD dopants to form the second LDD regions in a substrate of the integrated circuit adjacent to and extending partway under the second gate and to form another portion of the analog LDD regions in the substrate adjacent to and extending partway under the analog gate. A second halo implant process is performed which implants second halo dopants to form the second halo regions in the substrate adjacent to the second gate and extending past the second LDD regions under the second gate, and to form another portion of the analog halo regions in the substrate adjacent to the analog gate. The second halo implant process is performed in two sub-implants, at tilt angles of at least 15 degrees, with twist angles opposite from each other, so that each sub-implant of the two sub-implants has a twist angle perpendicular to the second gate and parallel to the analog gate. The second LDD mask is subsequently removed.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The term "gate length" is understood to refer to a physical lateral dimension of a gate of an MOS transistor in a direction of current flow under the gate. The lateral dimension of the gate corresponding to the gate length may possibly be shorter than a lateral dimension of the gate which is perpendicular to the current flow under the gate.

Figure 1A:
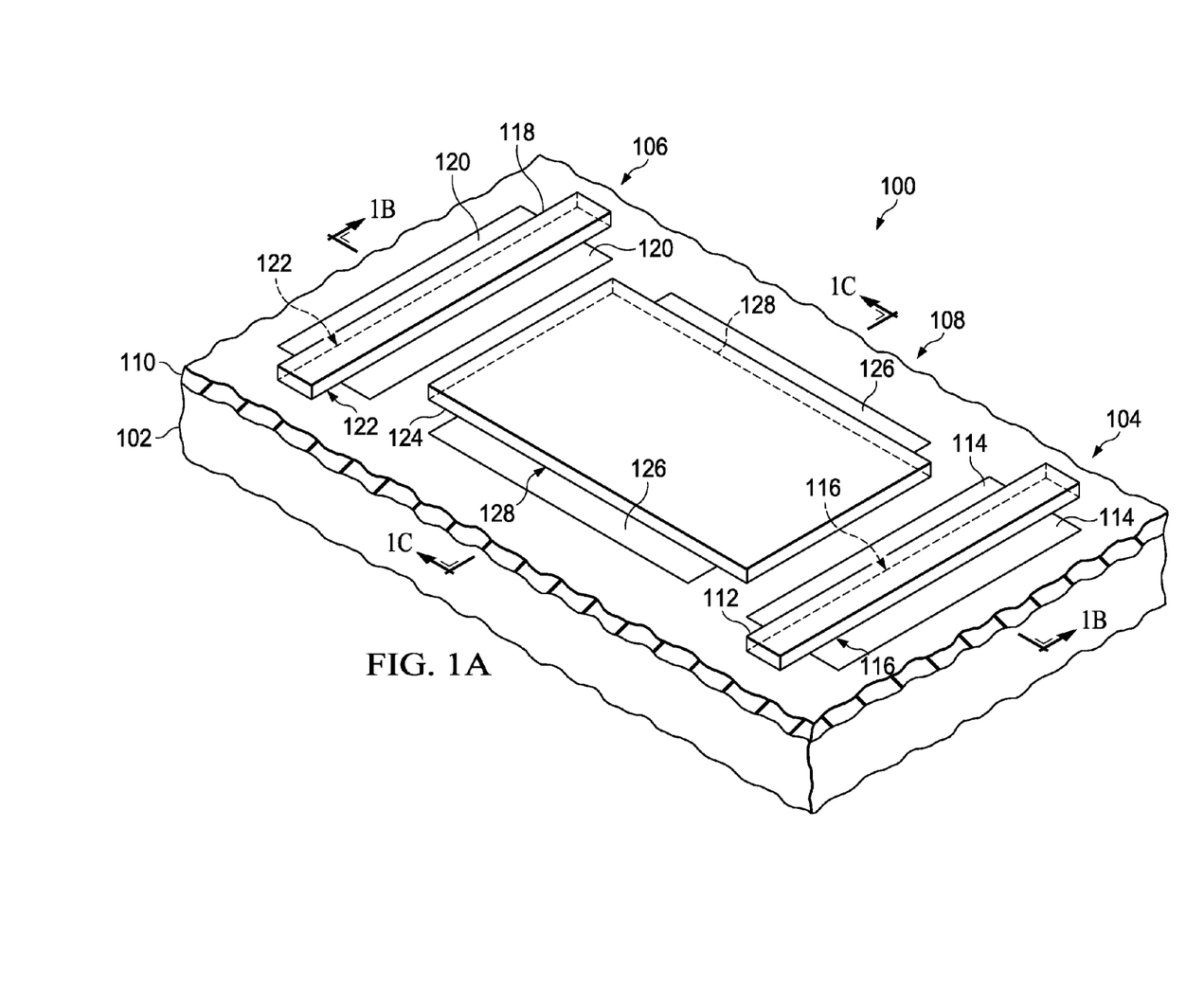
FIG. 1A is an isometric view of an example integrated circuit.

FIG. 1A is an isometric view of an example integrated circuit. The integrated circuit 100 is formed on a substrate 102 which includes semiconductor material such as single crystal silicon. The integrated circuit 100 includes a first digital MOS transistor 104, referred to herein as the first digital transistor 104, a second digital MOS transistor 106, referred to herein as the second digital transistor 106, and an analog MOS transistor 108, referred to herein as the analog transistor 108. The first digital transistor 104, the second digital transistor 106, and the analog transistor 108 all have a same polarity, that is are all n-channel or are all p-channel. Field oxide 110 may be disposed at a top surface of the substrate 102 to laterally isolate the first digital transistor 104, the second digital transistor 106, and the analog transistor 108.

The first digital transistor 104 includes a first gate 112 and first source/drain regions 114 in the substrate 102 adjacent to, and partway underlapping, the first gate 112. First gate edges 116 are defined as lower edges of the first gate 112 over the first source/drain regions 114. Current flow in the first digital transistor 104 is between the first source/drain regions 114 under the first gate 112, in a direction perpendicular to the first gate edges 116.

The second digital transistor 106 includes a second gate 118 and second source/drain regions 120 in the substrate 102 adjacent to, and partway underlapping, the second gate 118. Second gate edges 122 are defined as lower edges of the second gate 118 over the second source/drain regions 120. Current flow in the second digital transistor 106 is between the second source/drain regions 120 under the second gate 118, in a direction perpendicular to the second gate edges 122. The second gate edges 122 are substantially parallel to the first gate edges 116.

The analog transistor 108 includes an analog gate 124 and analog source/drain regions 126 in the substrate 102 adjacent to, and partway underlapping, the analog gate 124. Analog gate edges 128 are defined as lower edges of the analog gate 124 over the analog source/drain regions 126. Current flow in the analog transistor 108 is between the analog source/drain regions 126 under the analog gate 124, in a direction perpendicular to the analog gate edges 128. The analog gate edges 128 are substantially perpendicular to the first gate edges 116 and to the second gate edges 122.

Sidewall spacers on the first gate 112, the second gate 118 and the analog gate 124 are not shown in FIG. 1A to more clearly show the first gate edges 116, the second gate edges 122 and the analog gate edges 128. Sidewall spacers are formed before completion of the first source/drain regions 114, the second source/drain regions 120 and the analog source/drain regions 126. Sidewall spacers will be shown in the cross sections of FIG. 1B and FIG. 1C.

Figure 1B:
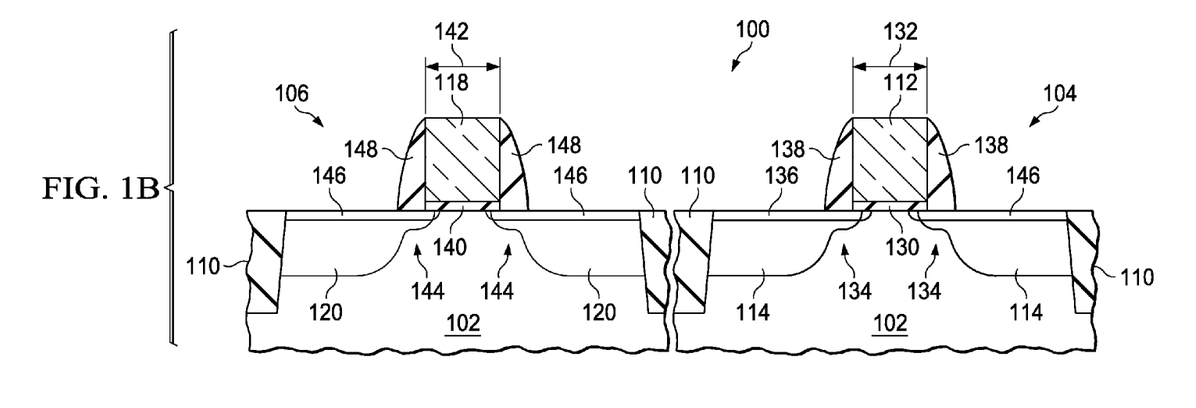
FIG. 1B is a cross section of the integrated circuit of FIG. 1A through the cut line 1B-1B.

FIG. 1B is a cross section of the integrated circuit 100 of FIG. 1A through the cut line 1B-1B, showing the first digital transistor 104 and the second digital transistor 106. In the first digital transistor 104, the first gate 112 is disposed over a gate dielectric layer 130 which is disposed over the substrate 102. The first gate 112 has a first gate length 132. The first source/drain regions 114 are disposed in the substrate 102 and include first LDD regions 134 which extend partway under the first gate 112. The first source/drain regions 114 have an appropriate conductivity type for a polarity of the first digital transistor 104. An n-channel version of the first digital transistor 104 has n-type first source/drain regions 114 and n-type first LDD regions 134, and has n-type dopants such as phosphorus and arsenic, and possibly antimony. A p-channel version of the first digital transistor 104 has p-type first source/drain regions 114 and p-type first LDD regions 134, and has p-type dopants such as boron and possibly gallium and/or indium. The first digital transistor 104 also includes first halo regions 136 in the substrate 102 extending partway under the first gate 112 past the first LDD regions 134. The first halo regions 136 have an opposite conductivity type from the first LDD regions 134. An n-channel version of the first digital transistor 104 has p-type first halo regions 136; a p-channel version of the first digital transistor 104 has n-type first halo regions 136. A doping density of the first halo regions 136 is lower than a doping density of the first LDD regions 134.

In the second digital transistor 106, the second gate 118 is disposed over a gate dielectric layer 140 which is disposed over the substrate 102. The second gate 118 has a second gate length 142. The first gate length 132 and the second gate length 142 are within 10 percent of each other, that is, a difference between the first gate length 132 and the second gate length 142 is less than 10 percent of an average of the first gate length 132 and the second gate length 142. In one version of the instant example, the first gate length 132 and the second gate length 142 are each less than 50 nanometers. The second source/drain regions 120 are disposed in the substrate 102 and include second LDD regions 144 which extend partway under the second gate 118. The second source/drain regions 120, including the second LDD regions 144, have the same conductivity type as the first source/drain regions 114. The second digital transistor 106 also includes second halo regions 146 in the substrate 102 extending partway under the second gate 118 past the second LDD regions 144. The second halo regions 146 have the same conductivity type as the first halo regions 136. A doping density of the second halo regions 146 is lower than a doping density of the second LDD regions 144. An average doping density of the first halo regions 136 is at least 20 percent more than an average doping density of the second halo regions 146.

Figure 1C:
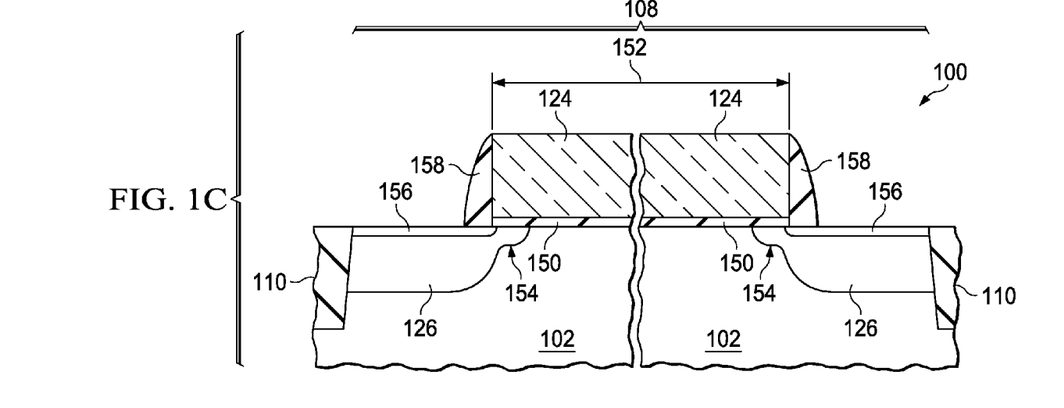
FIG. 1C is a cross section of the integrated circuit of FIG. 1A through the cut line 1C-1C.

FIG. 1C is a cross section of the integrated circuit 100 of FIG. 1A through the cut line 1C-1C, showing the analog transistor 108. In the analog transistor 108, the analog gate 124 is disposed over a gate dielectric layer 150 which is disposed over the substrate 102. The analog gate 124 has an analog gate length 152 which is at least twice the first gate length 132. In one version of the instant embodiment, in which the first gate length 132 and the second gate length 142 are each less than 50 nanometers, the analog gate length 152 is greater than 120 nanometers. The analog source/drain regions 126 are disposed in the substrate 102 and include analog LDD regions 154 which extend partway under the analog gate 124. The analog LDD regions 154 extend at least 3 nanometers farther under the analog gate 124 than the first LDD regions 134 extend under the first gate 112, and extend at least 3 nanometers farther under the analog gate 124 than the second LDD regions 144 extend under the second gate 118. The analog LDD regions 154 have an average doping density of at least 75 percent of a sum of an average doping density of the first LDD regions 134 and an average doping density of the second LDD regions 144. The analog source/drain regions 126, including the analog LDD regions 154, have the same conductivity type as the first source/drain regions 114. The analog transistor 108 also includes analog halo regions 156 in the substrate 102 extending up to, and possibly partway under, the analog gate 124. The analog halo regions 156 do not extend as far under the analog gate 124 as the analog LDD regions 154. The analog halo regions 156 have the same conductivity type as the first halo regions 136. A doping density of the analog halo regions 156 is lower than a doping density of the analog LDD regions 154. An average doping density of the analog halo regions 156 is at least 75 percent of a sum of the average doping density of the first halo regions 136 and the average doping density of the second halo regions 146.

The first digital transistor 104 has sidewall spacers 138 on lateral surfaces of the first gate 112 which are used to offset a main portion of the first source/drain regions 114 from the first gate 112. The second digital transistor 106 has sidewall spacers 148 on lateral surfaces of the second gate 118 which are used to offset a main portion of the second source/drain regions 120 from the second gate 118. The analog transistor 108 has sidewall spacers 158 on lateral surfaces of the analog gate 124 which are used to offset a main portion of the analog source/drain regions 126 from the analog gate 124. Any combination of the sidewall spacers 138 on the first gate 112, the sidewall spacers 148 on the second gate 118 and the sidewall spacers 158 on the analog gate 124 may be formed concurrently, or may possibly be formed separately.

The configuration in which the first halo regions 136 extend past the first LDD regions 134 under the first gate 112 may provide a desired off-state current in the first digital transistor 104. Similarly, the configuration in which the second halo regions 146 extend past the second LDD regions 144 under the second gate 118 may provide a desired off-state current in the second digital transistor 106. The higher average doping density of the first halo regions 136 compared to the average doping density of the second halo regions 146 may provide a desired higher threshold voltage of the first digital transistor 104 compared to a threshold voltage of the second digital transistor 106, for example at least 50 millivolts higher. In one example, the first digital transistor 104 may be in a logic gate such as a NAND gate or a NOR gate, and the second digital transistor 106 may be in a high speed circuit such as a ring oscillator. In another example, the first digital transistor 104 may be in a static random access memory (SRAM) cell such that the higher threshold provides more static noise margin, and the second digital transistor 106 may be in a logic gate. The configuration in which the analog LDD regions 154 extend at least 3 nanometers farther under the analog gate 124 than either the first LDD regions 134 extend under the first gate 112 or the second LDD regions 144 extend under the second gate 118, and the configuration in which the analog halo regions 156 do not extend as far under the analog gate 124 as the analog LDD regions 154, may provide a desired threshold voltage of the analog transistor 108 within a desired tolerance range.

Figure 2A:
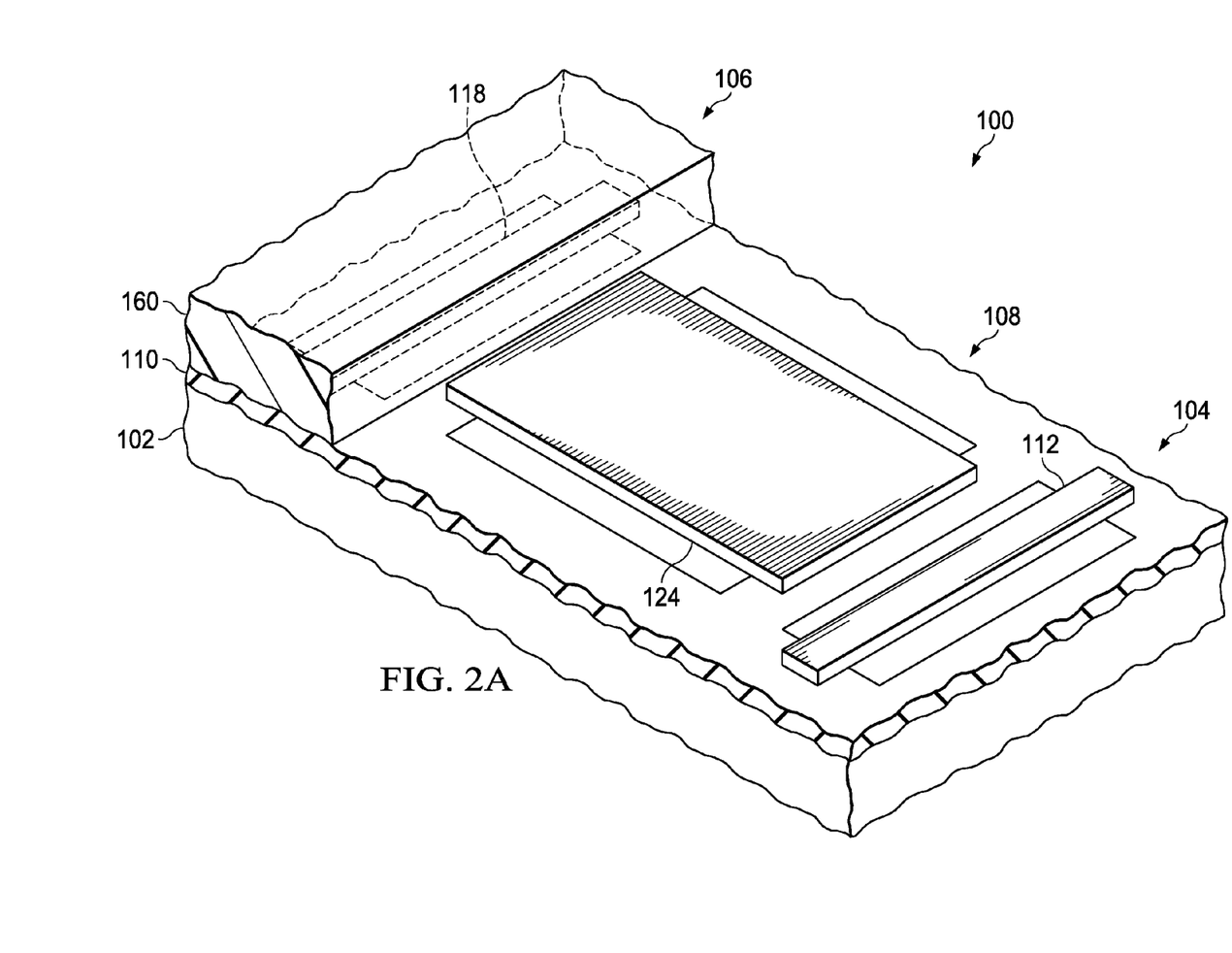
FIG. 2A through FIG. 2F are isometric views of the integrated circuit of FIG. 1A, depicted in successive stage of an example fabrication sequence for forming LDD regions and halo regions.

FIG. 2A through FIG. 2F are isometric views of the integrated circuit of FIG. 1A, depicted in successive stage of an example fabrication sequence for forming LDD regions and halo regions. Referring to FIG. 2A, a first LDD mask 160 is formed over the integrated circuit 100 so as to expose the first digital transistor 104 and the analog transistor 108 and cover the second digital transistor 106. The first LDD mask 160 may include photoresist formed by a photolithographic process, and may optionally include antireflection layers such as an organic bottom anti-reflection coating (BARC).

Figure 2B:
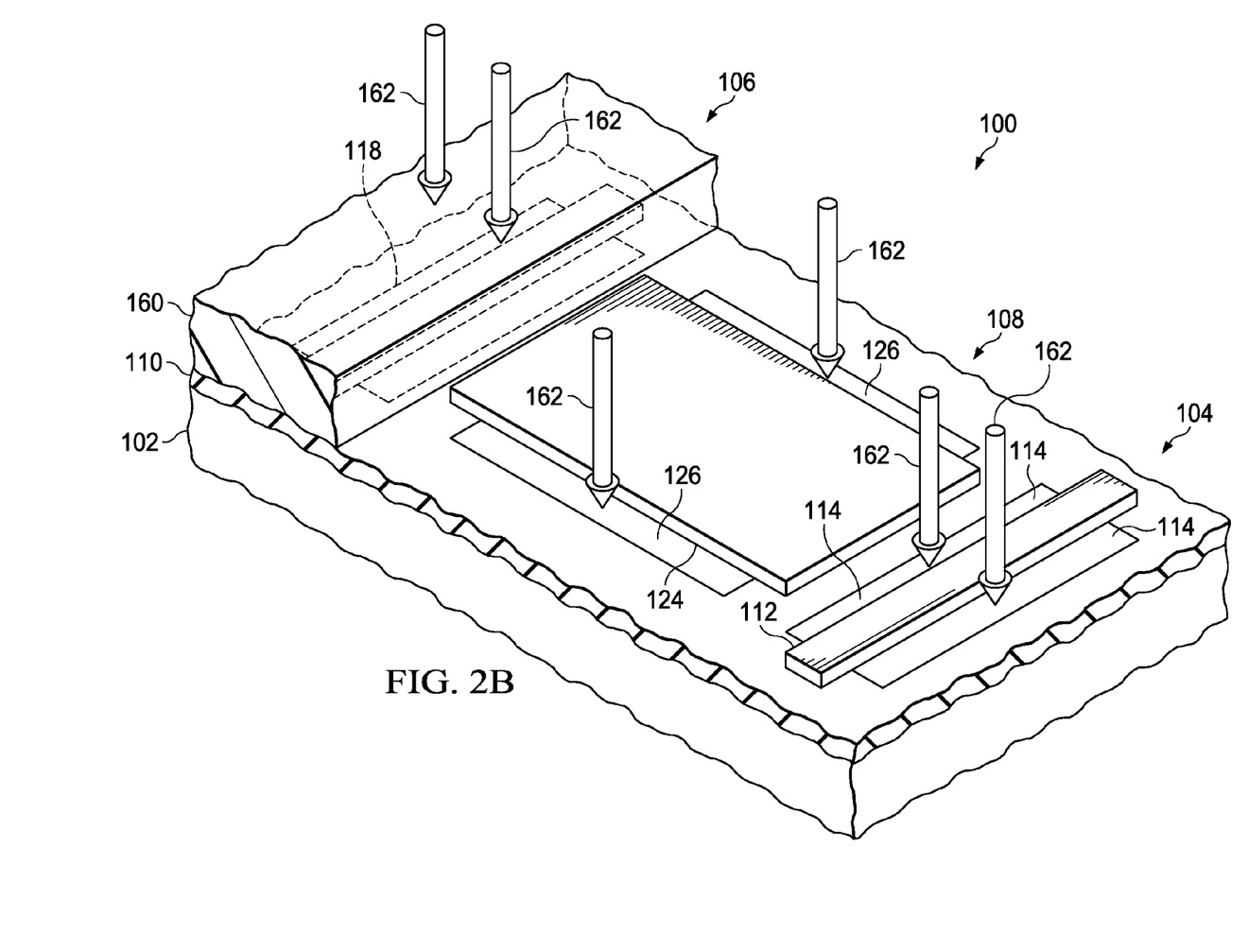

Referring to FIG. 2B, a first LDD implant process 162 is performed which implants first LDD dopants of a first conductivity type into the substrate 102 adjacent to the first gate 112 and the analog gate 124. The first LDD dopants are blocked from the substrate 102 adjacent to the second gate 118 by the first LDD mask 160. The first LDD implant process 162 is performed at a tilt angle of less than 5 degrees. In one version of the instant example, the first LDD implant process 162 may be performed in a single implant at a tilt angle of zero degrees, as indicated schematically in FIG. 2B. In another version of the instant example, the first LDD implant process 162 may be performed in 4 sub-implants, each at a tilt angle of 2 degrees to 3 degrees, at twist angles 90 degrees apart, to provide uniform implants on all sides of the first gate 112 and the analog gate 124. Other methods of performing the first LDD implant process 162, at a tilt angle of less than 5 degrees, are within the scope of the instant example. For n-channel instances of the first digital transistor 104 and the analog transistor 108, the first LDD dopants are n-type dopants and may include phosphorus and arsenic and possibly antimony at a total dose of $5 \times 10^{14}$ cm$^{-2}$ to $3 \times 10^{15}$ cm$^{-2}$. For p-channel instances of the first digital transistor 104 and the analog transistor 108, the first LDD dopants are p-type dopants and may include boron, possibly implanted as BF$_2$ or carborane, at a dose of $5 \times 10^{14}$ cm$^{-2}$ to $3 \times 10^{15}$ cm$^{-2}$.

Figure 2C:
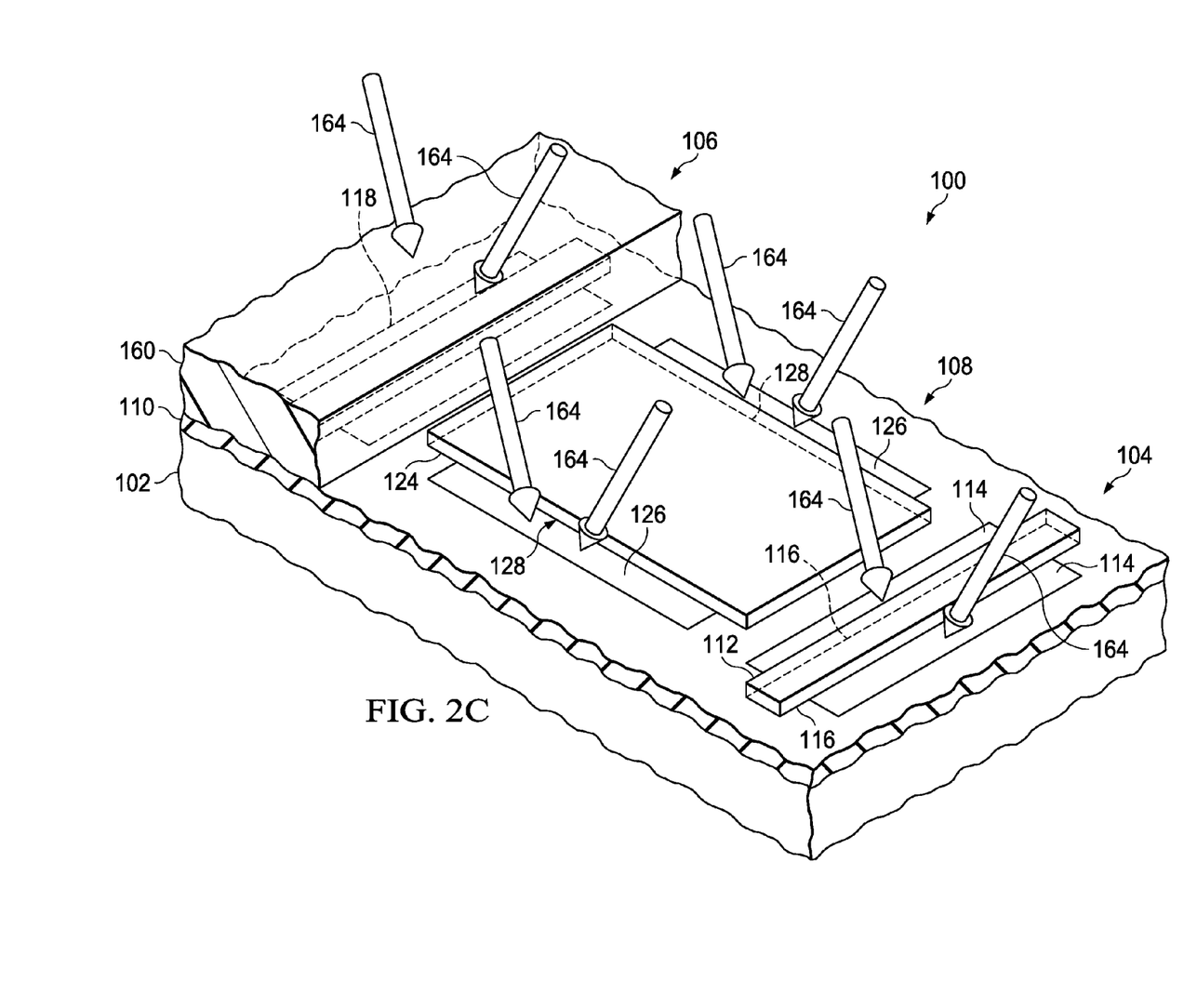

Referring to FIG. 2C, the first LDD mask 160 is left in place and a first halo implant process 164 is performed which implants first halo dopants of a second, opposite, conductivity type into the substrate 102 adjacent to the first gate 112 and the analog gate 124. The first halo dopants are blocked from the substrate 102 adjacent to the second gate 118 by the first LDD mask 160. The first halo implant process 164 is performed in two sub-implants, each at a tilt angle of at least 15 degrees, at twist angles which are substantially perpendicular to the first gate edges 116 and substantially parallel to the analog gate edges 128, as depicted in FIG. 2C. The first halo implant process 164 thus places the first halo dopants farther under the first gate 112 than under the analog gate 124. For n-channel instances of the first digital transistor 104 and the analog transistor 108, the first halo dopants are p-type and may include boron, possibly implanted as BF$_2$ or carborane, at a dose of $2 \times 10^{13}$ cm$^{-2}$ to $1 \times 10^{14}$ cm$^{-2}$. For p-channel instances of the first digital transistor 104 and the analog transistor 108, the first halo dopants are n-type and may include phosphorus and arsenic and possibly antimony at a total dose of $2 \times 10^{13}$ cm$^{-2}$ to $1 \times 10^{14}$ cm$^{-2}$.

The first halo implant process 164 may possibly be performed before the first LDD implant process 162 of FIG. 2B. Other elements, such as carbon, fluorine, nitrogen, silicon and/or germanium may be implanted while the first LDD mask 160 is in place, to provide desired spatial distributions of the first LDD dopants and the first halo dopants. The first LDD mask 160 is subsequently removed, for example by an ash process followed by a wet clean in an aqueous mixture of sulfuric acid and hydrogen peroxide.

Figure 2D:
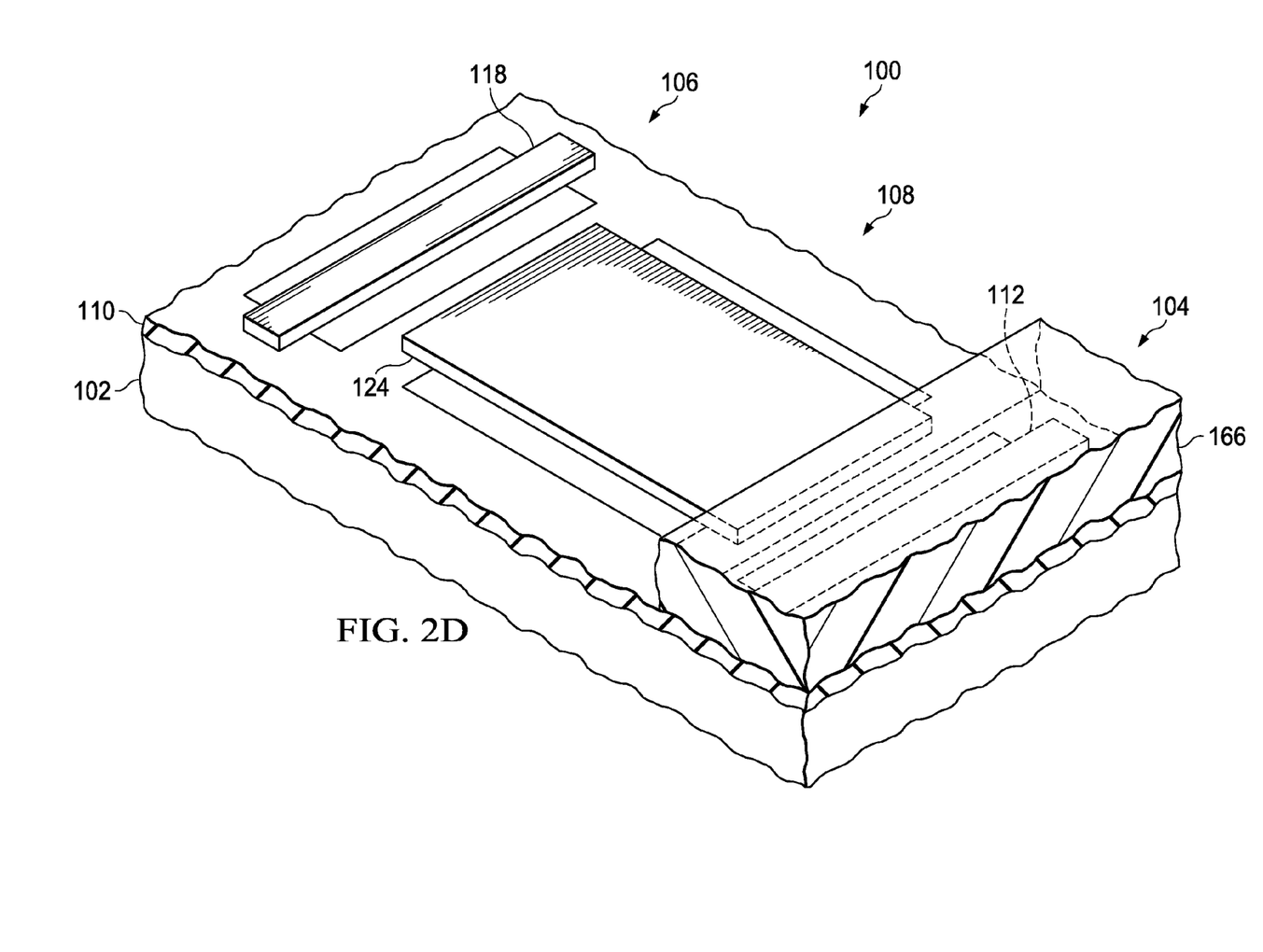

Referring to FIG. 2D, a second LDD mask 166 is formed over the integrated circuit 100 so as to expose the second digital transistor 106 and the analog transistor 108 and cover the first digital transistor 104. The second LDD mask 166 may be formed similarly to the first LDD mask 160 of FIG. 2A through FIG. 2C.

Figure 2E:
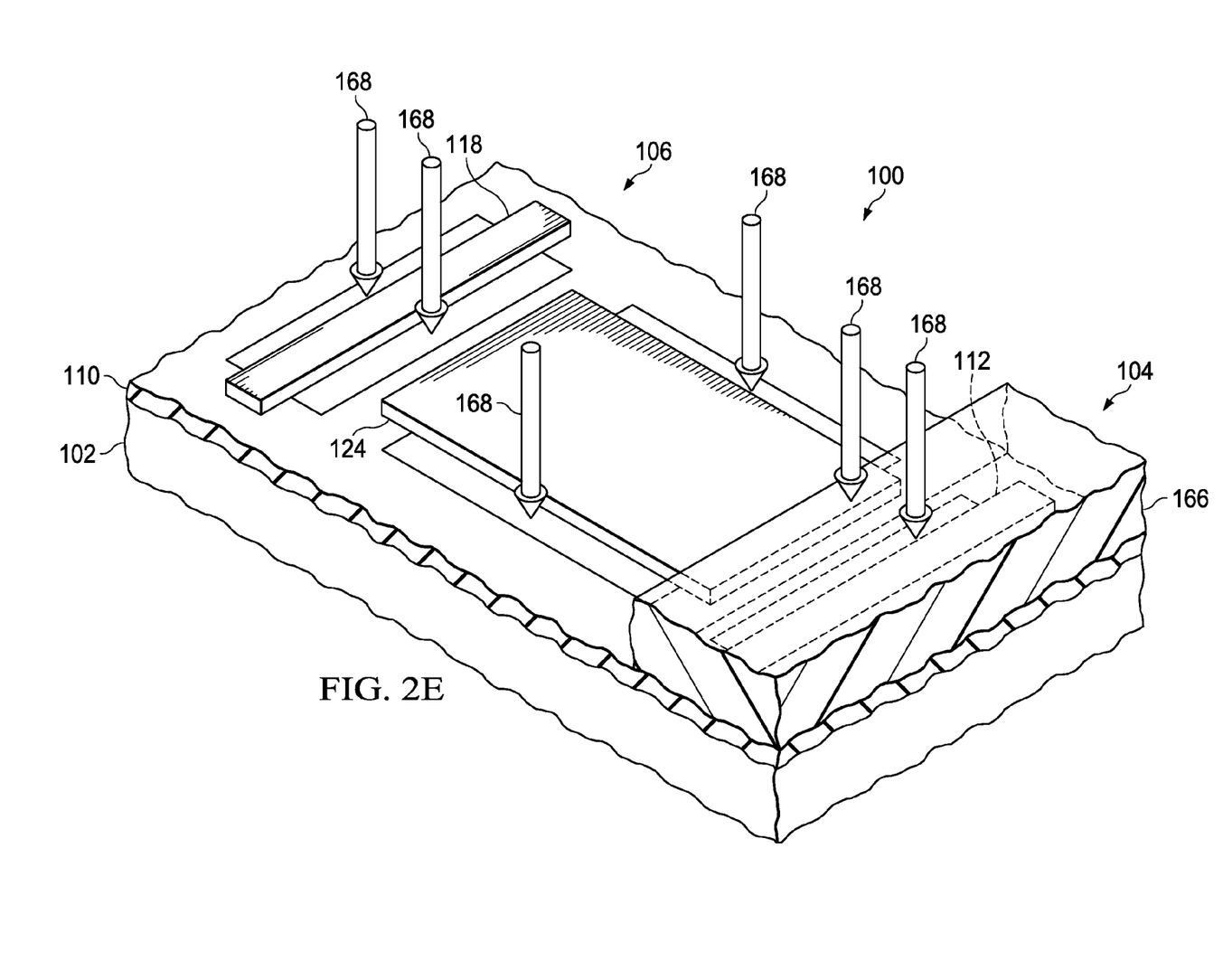

Referring to FIG. 2E, a second LDD implant process 168 is performed which implants second LDD dopants of the first conductivity type into the substrate 102 adjacent to the second gate 118 and the analog gate 124. The second LDD dopants are blocked from the substrate 102 adjacent to the first gate 112 by the second LDD mask 166. The second LDD implant process 168 is performed at a tilt angle of less than 5 degrees. The first LDD implant process 162 may be performed in any of the examples discussed in reference to FIG. 2B. Other methods of performing the second LDD implant process 168, at a tilt angle of less than 5 degrees, are within the scope of the instant example. For n-channel instances of the second digital transistor 106 and the analog transistor 108, the second LDD dopants may include the same n-type species and doses as described in reference to the first LDD dopants. For p-channel instances of the second digital transistor 106 and the analog transistor 108, the first LDD dopants may include the same p-type species and doses as described in reference to the first LDD dopants. In one version of the instant example, the dose of the first LDD implant process 162 and the dose of the second LDD implant process 168 may be substantially equal, within 10 percent. In another version, the dose of the second LDD implant process 168 may be at least 20 percent more than the dose of the first LDD implant process to provide a lower threshold in the second digital transistor 106 compared to the first digital transistor 104. Implanting the substrate 102 adjacent to the analog gate 124 with both the first LDD implant process 162 and the second LDD implant process 168 provides an increased dopant density in the analog LDD regions 154 of FIG. 1C which advantageously diffuse farther under the analog gate 124, and advantageously without incurring added fabrication cost and complexity for a separate analog LDD mask and implant process.

Figure 2F:
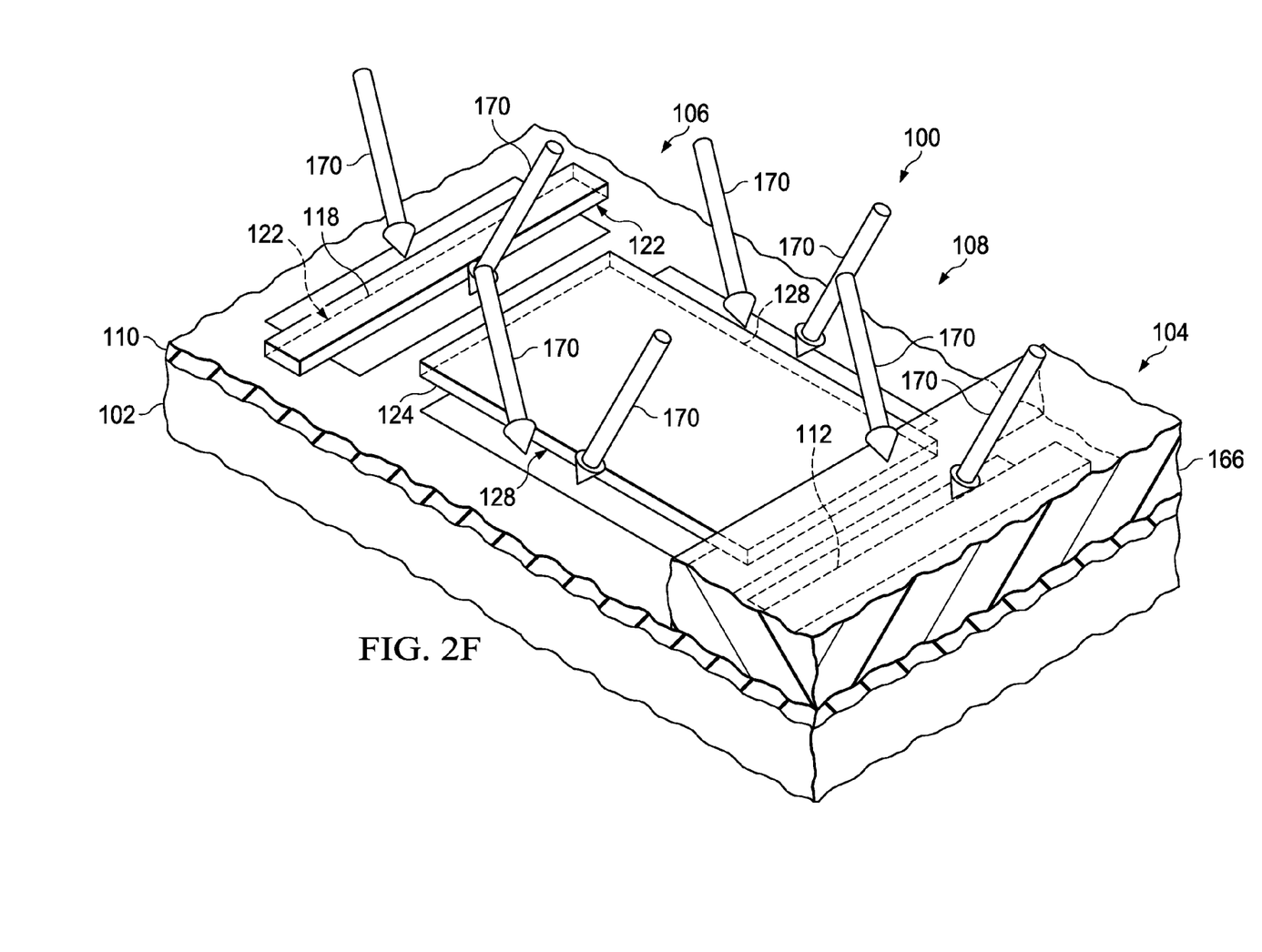

Referring to FIG. 2F, the second LDD mask 166 is left in place and a second halo implant process 170 is performed which implants second halo dopants of the second conductivity type into the substrate 102 adjacent to the second gate 118 and the analog gate 124. The second halo dopants are blocked from the substrate 102 adjacent to the first gate 112 by the second LDD mask 166. The second halo implant process 170 is performed in two sub-implants, each at a tilt angle of at least 15 degrees, at twist angles which are substantially perpendicular to the first gate edges 116 and substantially parallel to the analog gate edges 128, as depicted in FIG. 2F. The second halo implant process 170 thus places the second halo dopants farther under the second gate 118 than under the analog gate 124. The dopant species of the second halo dopants may be the same as the dopant species for the first halo dopants, described in reference to FIG. 2C. The dose of the first halo implant process 164 is at least 20 percent more than a dose of the second halo implant process 170. The dose of the first halo implant process 164 is higher than the dose of the second halo implant process 170 to provide a higher threshold, in the second digital transistor 106 compared to the first digital transistor 104.

The second halo implant process 170 may possibly be performed before the second LDD implant process 168 of FIG. 2B. Other elements may be implanted while the second LDD mask 166 is in place, to provide desired spatial distributions of the second LDD dopants and the second halo dopants. The second LDD mask 166 is subsequently removed, for example as described in reference to FIG. 2C.

Figure 3A:
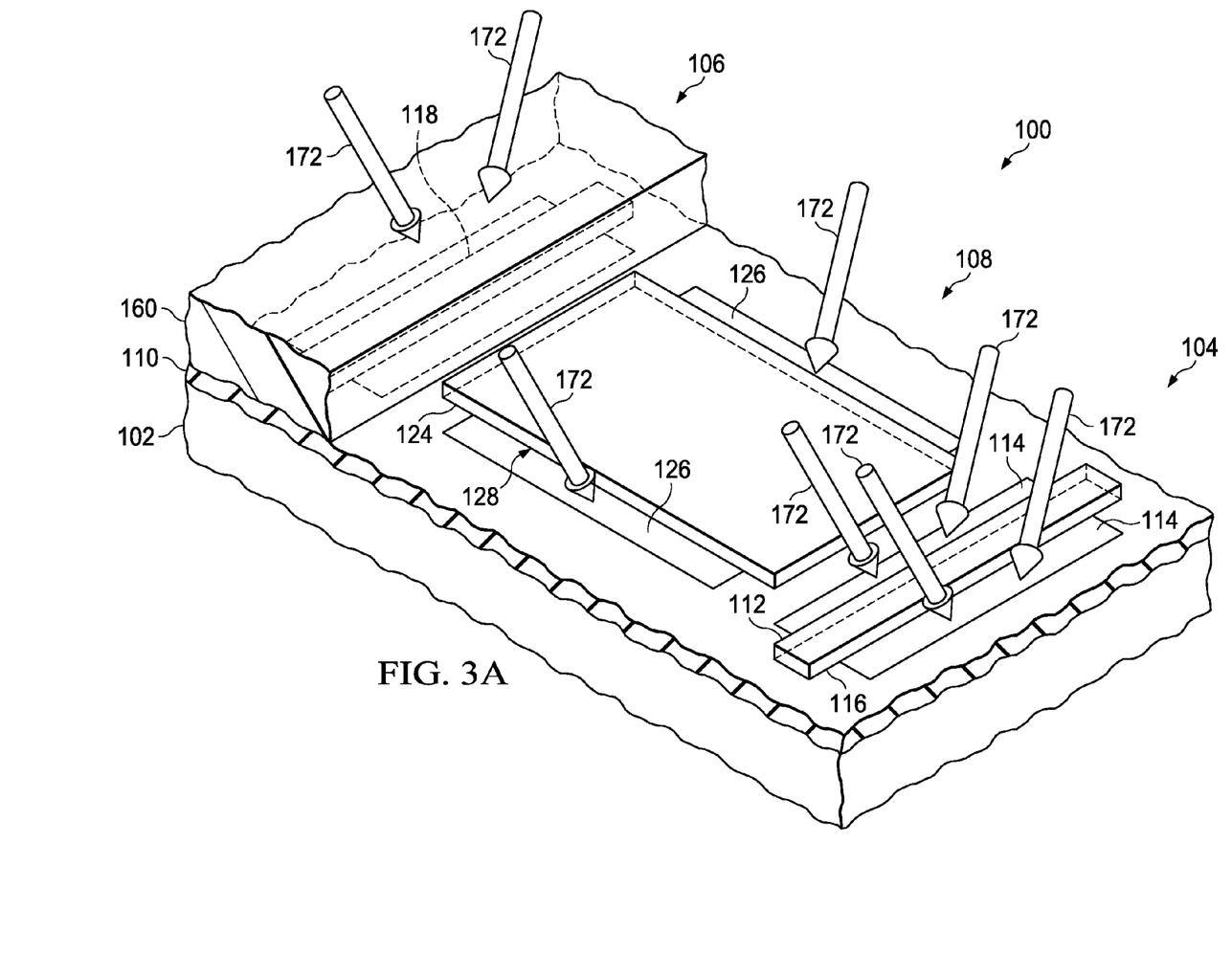
FIG. 3A and FIG. 3B are isometric views of the integrated circuit of FIG. 1A, depicted in an alternate fabrication sequence for forming LDD regions.
Figure 3B:
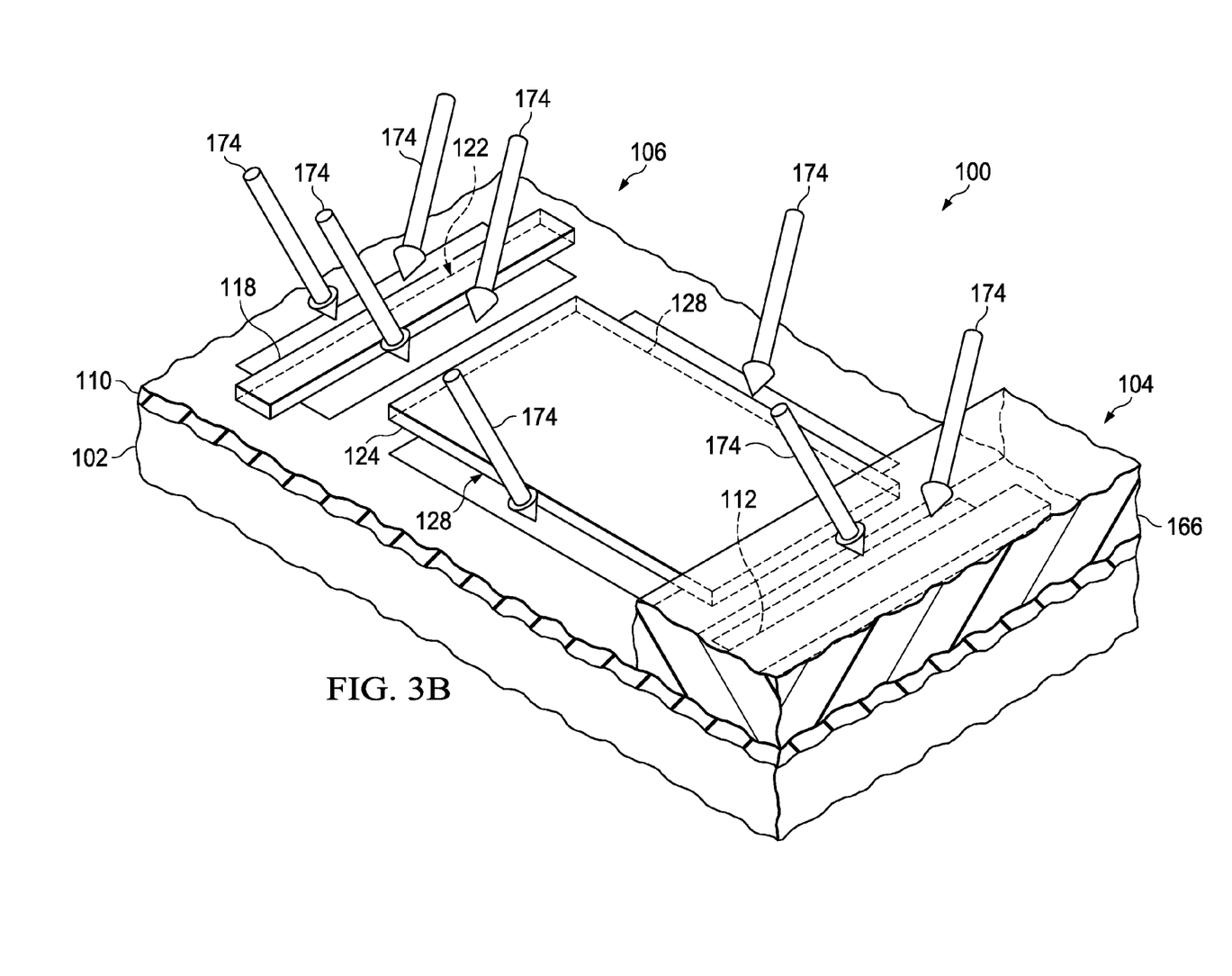

FIG. 3A and FIG. 3B are isometric views of the integrated circuit of FIG. 1A, depicted in an alternate fabrication sequence for forming LDD regions. Referring to FIG. 3A, the first LDD mask 160 is formed over the integrated circuit 100 so as to expose the first digital transistor 104 and the analog transistor 108 and cover the second digital transistor 106 as described in reference to FIG. 2A. An angled first LDD implant process 172 is performed which implants the first LDD dopants into the substrate 102 adjacent to the first gate 112 and the analog gate 124. The first LDD dopants are blocked from the substrate 102 adjacent to the second gate 118 by the first LDD mask 160. The angled first LDD implant process 172 is performed in two sub-implants, each at a tilt angle of at least 10 degrees, at twist angles which are substantially parallel to the first gate edges 116 and substantially perpendicular to the analog gate edges 128, as depicted in FIG. 3A. Dopant species and doses for the angled first LDD implant process 172 may be similar to those described in reference to the first LDD implant process 162 of FIG. 2B. The angled first LDD implant process 172 thus advantageously places the first LDD dopants farther under the analog gate 124 than under the first gate 112. The first halo implant process is performed as described in reference to FIG. 2C while the first LDD mask 160 is in place. The first LDD mask 160 is subsequently removed.

Referring to FIG. 3B, the second LDD mask 166 is formed over the integrated circuit 100 so as to expose the second digital transistor 106 and the analog transistor 108 and cover the first digital transistor 104 as described in reference to FIG. 2D. An angled second LDD implant process 174 is performed which implants the second LDD dopants into the substrate 102 adjacent to the second gate 118 and the analog gate 124. The second LDD dopants are blocked from the substrate 102 adjacent to the first gate 112 by the second LDD mask 166. The angled second LDD implant process 174 is also performed in two sub-implants, each at a tilt angle of at least 10 degrees, at twist angles which are substantially parallel to the second gate edges 122 and substantially perpendicular to the analog gate edges 128, as depicted in FIG. 3B. Dopant species and doses for the angled second LDD implant process 174 may be similar to those described in reference to the second LDD implant process 168 of FIG. 2E. The angled second LDD implant process 174 thus advantageously places the second LDD dopants farther under the analog gate 124 than under the second gate 118. The second halo implant process is performed as described in reference to FIG. 2F while the second LDD mask 166 is in place. The second LDD mask 166 is subsequently removed.

In an alternate fabrication sequence, the integrated circuit 100 may be formed using the first LDD implant process 162 as described in reference to FIG. 2B and the angled second LDD implant process 174 as described in reference to FIG. 3B. In a further fabrication sequence, the integrated circuit 100 may be formed using the angled first LDD implant process 172 as described in reference to FIG. 3A and the second LDD implant process 168 as described in reference to FIG. 2E.

After the LDD implant processes and halo implant processes have been completed, the sidewall spacers 138, 148 and 158 of FIG. 1B and FIG. 1C are formed and source/drain implant processes are performed to form the first source/drain regions 114 in the first digital transistor 104, the second source/drain regions 120 in the second digital transistor 106 and the analog source/drain regions 126 in the analog transistor 108, to provide the structure of FIG. 1A through FIG. 1C.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an integrated circuit, comprising the steps:

providing a substrate comprising semiconductor material;

forming a first gate of a first digital transistor having a first gate length;

forming a second gate of a second digital transistor parallel to said first gate having a second gate length within 10 percent of said first gate length;

forming an analog gate of an analog transistor perpendicular to said first gate and said second gate having an analog gate length at least twice said first gate length;

forming a first LDD mask over said integrated circuit so as to expose said first digital transistor and said analog transistor and cover said second digital transistor;

implanting first LDD dopants of a first conductivity type into said substrate adjacent to said first gate and said analog gate, while said first LDD mask is in place;

implanting first halo dopants of a second, opposite, conductivity type into said substrate adjacent to said first gate and said analog gate, in two sub-implants at tilt angles of at least 15 degrees and twist angles which are substantially perpendicular to gate edges of said first digital transistor and substantially parallel to gate edges of said analog transistor, while said first LDD mask is in place;

removing said first LDD mask;

forming a second LDD mask over said integrated circuit so as to expose said second digital transistor and said analog transistor and cover said first digital transistor;

implanting second LDD dopants of said first conductivity type into said substrate adjacent to said second gate and said analog gate, while said second LDD mask is in place;

implanting second halo dopants of said second conductivity type having a dose 20 percent less than a dose of said first halo dopants into said substrate adjacent to said second gate and said analog gate, in two sub-implants at tilt angles of at least 15 degrees and twist angles which are substantially perpendicular to gate edges of said second digital transistor and substantially parallel to said gate edges of said analog transistor, while said second LDD mask is in place; and removing said second LDD mask.

2. The method of claim 1, wherein:
said first LDD dopants are implanted at a tilt angle of less than 5 degrees; and
said second LDD dopants are implanted at a tilt angle of less than 5 degrees.

3. The method of claim 2, wherein:
said first LDD dopants are implanted in a single implant at a tilt angle of zero degrees; and
said second LDD dopants are implanted in a single implant at a tilt angle of zero degrees.

4. The method of claim 2, wherein:
said first LDD dopants are implanted in 4 sub-implants, each at a tilt angle of 2 degrees to 3 degrees, at twist angles 90 degrees apart; and said second LDD dopants are implanted in 4 sub-implants, each at a tilt angle of 2 degrees to 3 degrees, at twist angles 90 degrees apart.

5. The method of claim 1, wherein:
said first LDD dopants are implanted in two sub-implants at tilt angles of at least 10 degrees and twist angles which are substantially parallel to said gate edges of said first digital transistor and substantially perpendicular to said gate edges of said analog transistor; and
said second LDD dopants are implanted at a tilt angle of less than 5 degrees.

6. The method of claim 1, wherein:
said first LDD dopants are implanted at a tilt angle of less than 5 degrees; and
said second LDD dopants are implanted in two sub-implants at tilt angles of at least 10 degrees and twist angles which are substantially parallel to said gate edges of said second digital transistor and substantially perpendicular to said gate edges of said analog transistor.

7. The method of claim 1, wherein:
said first LDD dopants are implanted in two sub-implants at tilt angles of at least 10 degrees and twist angles which are substantially parallel to said gate edges of said first digital transistor and substantially perpendicular to said gate edges of said analog transistor; and
said second LDD dopants are implanted in two sub-implants at tilt angles of at least 10 degrees and twist angles which are substantially parallel to said gate edges of said second digital transistor and substantially perpendicular to said gate edges of said analog transistor.

8. The method of claim 1, wherein a dose of said first LDD dopants is within 10 percent of a dose of said second LDD dopants.

9. The method of claim 1, wherein a dose of said second LDD dopants is 20 percent higher than a dose of said first LDD dopants.

10. The method of claim 1, wherein said first conductivity type is p-type and said second conductivity type is n-type.

11. The method of claim 10, wherein said first LDD dopants comprise p-type dopants selected from the group consisting of boron, $BF_2$ and carborane.

12. The method of claim 1, wherein said first conductivity type is n-type and said second conductivity type is p-type.

13. The method of claim 1, wherein:
said first LDD dopants are implanted at a dose of $5\times10^{14}$ $cm^{-2}$ to $3\times10^{15}$ $cm^{-2}$; and
said second LDD dopants are implanted at a dose of $5\times10^{14}$ $cm^{-2}$ to $3\times10^{15}$ $cm^{-2}$.

14. The method of claim 1, wherein said first gate length and said second gate length are each less than 50 nanometers and said analog gate length is more than 120 nanometers.

* * * * *